(12) United States Patent
Strain et al.

(10) Patent No.: US 9,847,404 B2
(45) Date of Patent: Dec. 19, 2017

(54) FLUCTUATION RESISTANT FINFET

(71) Applicants: Gold Standard Simulations Ltd., Glasgow, Scotland (GB); Semi Solutions LLC, Los Gatos, CA (US)

(72) Inventors: Robert J. Strain, San Jose, CA (US); Asen Asenov, Glasgow (GB)

(73) Assignees: SemiWise Limited, Glasgow, Scotland (GB); Semi Solutions LLC, Los Gatos, CA (US)

( * ) Notice: Subject to any disclaimer, the term of this patent is extended or adjusted under 35 U.S.C. 154(b) by 44 days.

(21) Appl. No.: 14/024,415

(22) Filed: Sep. 11, 2013

(65) Prior Publication Data

US 2015/0008490 A1 Jan. 8, 2015

Related U.S. Application Data

(60) Provisional application No. 61/843,331, filed on Jul. 6, 2013.

(51) Int. Cl.
*H01L 29/66* (2006.01)
*H01L 29/78* (2006.01)
*H01L 29/10* (2006.01)
*H01L 21/308* (2006.01)

(52) U.S. Cl.
CPC .... *H01L 29/66795* (2013.01); *H01L 21/3083* (2013.01); *H01L 29/1041* (2013.01);
(Continued)

(58) Field of Classification Search
CPC ............. H01L 29/1041; H01L 29/1054; H01L 29/785; H01L 29/66795; H01L 29/66818
See application file for complete search history.

(56) References Cited

U.S. PATENT DOCUMENTS 5,844,278 A 12/1998 Mizuno et al.
6,566,734 B2 5/2003 Sugihara et al.
(Continued)

FOREIGN PATENT DOCUMENTS

JP 02-015675 1/1990
WO WO-2007/046150 4/2007
WO WO-2009/040707 4/2009

OTHER PUBLICATIONS

"Office Action dated Nov. 25, 2014; U.S. Appl. No. 14/051,163", (Nov. 25, 2014).
(Continued)

*Primary Examiner* — Jesse Y Miyoshi
*Assistant Examiner* — Nilufa Rahim
(74) *Attorney, Agent, or Firm* — Blakely Sokoloff Taylor & Zafman LLP

(57) ABSTRACT

This improved, fluctuation resistant FinFET, with a doped core and lightly doped epitaxial channel region between that core and the gate structure, is confined to the active-gate span because it is based on a channel structure having a limited extent. The improved structure is capable of reducing FinFET random doping fluctuations when doping is used to control threshold voltage, and the channel structure reduces fluctuations attributable to doping-related variations in effective channel length. Further, the transistor design affords better source and drain conductance when compared to prior art FinFETs. Two representative embodiments of the key structure are described in detail.

21 Claims, 10 Drawing Sheets

(52) U.S. Cl.
CPC .... *H01L 29/1054* (2013.01); *H01L 29/66818* (2013.01); *H01L 29/785* (2013.01); *H01L 29/7853* (2013.01)

(56) References Cited

U.S. PATENT DOCUMENTS

| | | | |
|---|---|---|---|
| 6,627,488 B2 | 9/2003 | Lee | |
| 2005/0051812 A1* | 3/2005 | Dixit et al. | 257/250 |
| 2006/0071275 A1 | 4/2006 | Brask et al. | |
| 2008/0290470 A1* | 11/2008 | King et al. | 257/622 |
| 2009/0321835 A1 | 12/2009 | Wirbeleit | |
| 2009/0321849 A1 | 12/2009 | Miyamura et al. | |
| 2010/0237436 A1* | 9/2010 | Inaba | H01L 27/0924 257/392 |
| 2013/0049140 A1 | 2/2013 | Asenov et al. | |
| 2013/0277766 A1* | 10/2013 | Kelwing | H01L 21/28185 257/411 |
| 2014/0367787 A1* | 12/2014 | Vakada et al. | 257/369 |

OTHER PUBLICATIONS

"International Search Report and Written Opinion of the International Searching Authority dated Jan. 23, 2014; International Application No. PCT/US2013/064885", (Jan. 23, 2014).

Asenov, Asen, et al., "Suppression of Random Dopant-Induced Threshold Voltage Fluctuations in Sub-0.1-μm MOSFET's with Epitaxial and δ-Doped Channels", *IEEE Transactions on Electron Devices*, vol. 46, No. 8, (Aug. 1999), pp. 1718-1724.

Chiang, Meng-Hsueh, et al., "Random Dopant Fluctuation in Limited-Width FinFET Technologies", *IEEE Transactions on Electron Devices*, vol. 54, No. 8, (Aug. 2007), pp. 2055-2060.

Hisamoto, Digh, et al., "Impact of the Vertical SOI "Delta" Structure on Planar Device Technology", *IEEE Transactions on Electron Devices*, vol. 38, No. 6, (Jun. 1991), pp. 1419-1424.

Huang, Xuejue, et al., "Sub 50-nm FinFET: PMOS", *1999 Electron Devices Meeting, IEDM Technical Digest International*, (Dec. 1999), pp. 67-70.

Takeuchi, Kiyoshi, et al., "Channel Engineering for the Reduction of Random-Dopant-Placement-Induced Threshold Voltage Fluctuation", *1997 International Electron Devices Meeting (IEDM)*, Technical Digest, (Dec. 7-10, 1997), pp. 841-844.

"Office Action dated Jan. 27, 2015; U.S. Appl. No. 14/051,163", (Jan. 27, 2015).

"Office Action dated Jun. 8, 2015; U.S. Appl. No. 14/051,163", (Jun. 8, 2015).

"Office Action dated Oct. 1, 2015; U.S. Appl. No. 14/051,163", (Oct. 1, 2015).

\* cited by examiner

FLUCTUATION RESISTANT FINFET

CROSS-REFERENCE TO RELATED APPLICATIONS

This application claims the benefit of U.S. Provisional Patent Application No. 61/843,331 filed Jul. 6, 2013.

BACKGROUND OF THE INVENTION

1. Field of the Invention

The present invention generally relates to the manufacturing of metal-oxide-semiconductor field effect transistors (MOSFETs), and more particularly to FinFETs and other transistors based on an active region perpendicular to the plane of the silicon wafer. Even more specifically, this invention deals with those instances where random variations of the threshold voltages of such transistors adversely affect integrated circuit performance.

2. Prior Art

Transistors built on a silicon fin were demonstrated as early as 1991 (Hisamoto, D., et al., "Impact of the vertical SOI 'DELTA' structure on planar device technology," *Electron Devices, IEEE Transactions on*, vol. 38, no. 6, pp. 1419-1424, June 1991) with the goal of achieving better transconductance and superior On/Off ratios. The fin structure was identified for its superior short channel performance in the late 1990's (Xuejue Huang, et al., "Sub 50-nm FinFET: PMOS," *Electron Devices Meeting, 1999. IEDM Technical Digest. International*, pp. 67-70, December 1999) from which the name FinFET came to represent this class of transistor. The absence of doping ions in FinFETs promised the absence of random variation in threshold voltage ($\sigma V_T$) attributable to random doping fluctuations (Meng-Hsueh Chiang, et al., "Random Dopant Fluctuation in Limited-Width FinFET Technologies," *Electron Devices, IEEE Transactions on*, vol. 54, no. 8, pp. 2055-2060, August 2007), but that promise fails when the fin is doped. For traditional planar transistors, several artisans have shown that an epitaxial channel can significantly reduce the threshold variations due to random doping fluctuations. Representative publications include Takeuchi, K., et al., "Channel engineering for the reduction of random-dopant-placement-induced threshold voltage fluctuation," *Electron Devices Meeting, 1997. IEDM '97. Technical Digest., International*, pp. 841-844, December 1997 and Asenov, A., Saini, S., "Suppression of random dopant-induced threshold voltage fluctuations in sub-0.1-μm MOSFET's with epitaxial and δ-doped channels," *Electron Devices, IEEE Transactions on*, vol. 46, no. 8, pp. 1718-1724, August 1999.

For very small transistors, variations in threshold voltage due to random doping variations are inevitable because the uncertainty in any group of N items, ionized doping ions in this case, is approximately $N^{1/2}$. For an ensemble of $10^6$ or $10^8$ ions, the $N^{1/2}$ uncertainty is $10^3$ or $10^4$ respectively, small (<1%) compared to the overall number of doping ions. However, for nanometer scale transistors, the depleted volume is in the range of $5\times10^{-18}$ cm$^3$. If the doping level is $10^{19}$/cm$^3$, the mean number of active dopants is about 50, and the standard deviation in that number is just over 7. That represents an uncertainty of 14%. Modern transistors use high-K gate stacks and gate work function engineering to allow the use of a lightly doped substrate, which reduces the impact of the doping uncertainties. The impact of uncertainty due to variation in the number of dopant atoms continues to pose a challenge because the effect becomes more important as transistors get smaller. As long as FinFET or TriGate transistors are manufactured with fins that are free of doping, they are highly immune to threshold variations arising from the random dopant variations. Work function engineering has made that feasible for some ranges of threshold voltages, but if higher threshold voltages are required, doping the fins becomes necessary. Once the fins are doped, the N doping atoms in the fin determine the threshold voltage, and the threshold variation due to random distribution of the dopant atoms (the $N^{1/2}$ problem) comes to the fore. The understanding that has come from analysis of planar epitaxial MOSFETs shows that providing separation between the gate-to-channel interface and the ionized charges mitigates the effect of random doping variations, substantially reducing the resulting variations in threshold voltage.

Another vein of activity in planar transistors has been disclosed by Sugihara et al. in U.S. Pat. No. 6,566,734, "Semiconductor device," and in a different form by Lee in U.S. Pat. No. 6,627,488, "Method for fabricating a semiconductor device using a damascene process." In certain embodiments, Sugihara prepares a transistor by selectively etching the silicon substrate in the channel region, then growing an epi layer in that recess. The goals of these actions are to provide better control of the channel doping, less intrusion of the lightly doped drain regions into the channel, and stress management. Lee prepares a similar structure using what he describes as a damascene process. Lee addresses problems associated with the plasma etching required for a planar Gate Last process, and he also employs implants in the recess to create a highly retrograde doping profile beneath the active channel. Asenov went beyond the ideas of Sugihara and Lee to incorporate RDD mitigation in a "Channel Last" planar transistor device as described in US 2013/0049140 A1, "Variation Resistant Metal-Oxide-Semiconductor Field Effect Transistor (MOSFET)."

FIGS. 1a-1d show schematic representations of four representative classes of three-dimensional transistors, all of which are prior art with respect to this invention. In each case the cross section represents the zone between the source and drain, and beneath the gate, i.e., the active channel. Current flow would be perpendicular to the plane of these diagrams. FIG. 1a shows a TriGate transistor in which the fin 13 contacts the substrate 10, penetrating the isolation oxide 11. The region identified as 13 is the active fin, which may be undoped or doped to a level that sets the appropriate threshold voltage. The active fin 13 is surrounded by a gate dielectric 16, which is typically a high-K gate stack. The gate electrode 17 is normally a metal chosen for its work function, one of the key factors in defining the threshold voltage. Finally, the region 18 represents a deposited layer that provides both electrical contact and mechanical protection for the metal gate 17. Region 18 is typically amorphous silicon. Typical materials for the metal gate include TiN, but many other materials are being used or considered.

FIG. 1b shows a FinFET in which the active fin's cross section 13 resembles a triangle, and it is connected to the substrate 10. This transistor structure is completed by the isolation oxide 11, a high-K gate stack 16, a metal gate 17 and a gate connection 18, typically amorphous silicon.

FIG. 1c shows an alternative TriGate structure, but the fin 13 is fully isolated from the substrate 10 by a buried oxide 12 because this is an SOI TriGate FET. The balance of the structure resembles FIGS. 1a and 1b, with a high-K gate stack 16, a metal gate 17 and a gate contacting layer 18.

FIG. 1d shows a more classical SOI FinFET, with a nitride cap 14 on the fin 13 that assures the conducting channels in the active transistor are confined to the vertical walls of the fin 13. The structure includes the substrate 10, a buried oxide 12, a high-K gate stack 16, a metal gate 17 and a gate contactor 18.

BRIEF DESCRIPTION OF THE DRAWINGS

The subject matter that is regarded as the invention is particularly pointed out and distinctly claimed in the claims at the conclusion of the specification. The foregoing and other objects, features, and advantages of the invention will be apparent from the following detailed description taken in conjunction with the accompanying drawings.

DETAILED DESCRIPTION OF THE PREFERRED EMBODIMENTS

Figures 1A, 1B, 1C, 1D:
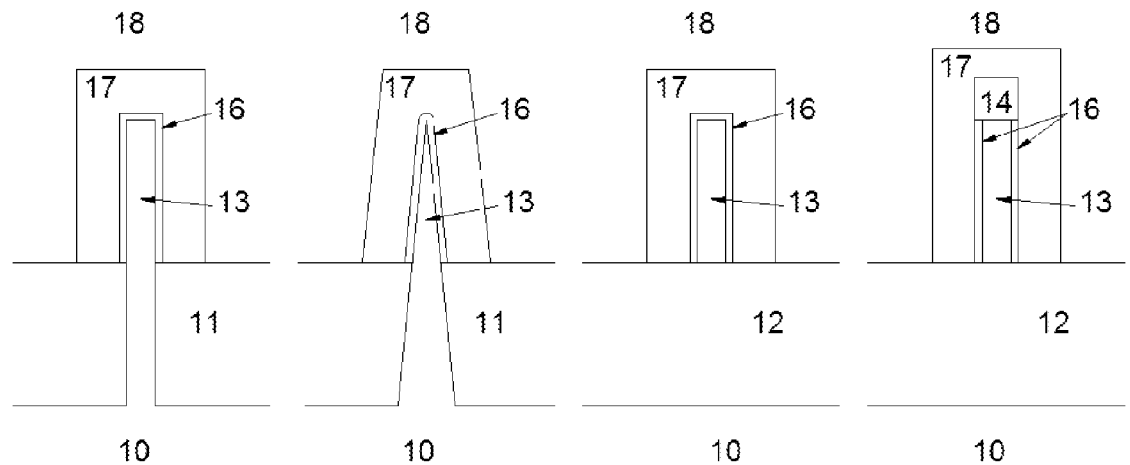
FIGS. 1a-1d present the schematic cross sections of four conventionally fabricated FinFETs, representing the regions of their gates. (PRIOR ART).

The prior art FinFET transistors lack the advantages associated with an undoped region separating the gate and the charge layer that sets their threshold voltages. While epitaxial transistors, planar or FinFET, offer that advantage, they and non-epitaxial FinFETs both suffer from random threshold variations due to the statistical uncertainties associated with the location of the drain extension implant boundaries. By introducing a spatially confined channel structure to FinFETs, the advantages of gate-to-charge separation and sharply defined drain extension edges can be extended to the three dimensional transistor devices.

The embodiments disclosed by the invention are only examples of the many possible advantageous uses and implementations of the innovative teachings presented herein. In general, statements made in the specification of the present application do not necessarily limit any of the various claimed inventions. Moreover, some statements may apply to some inventive features but not to others. In general, unless otherwise indicated, singular elements may be in plural and vice versa with no loss of generality. In the drawings, like numerals refer to like parts through several views.

This improved, fluctuation resistant FinFET, with a doped core and lightly doped epitaxial channel region between that core and the gate structure, is confined to the active-gate span because it is based on a channel structure having a limited extent. The improved structure is capable of reducing FinFET random doping fluctuations when doping is used to control threshold voltage, and the etched channel structure reduces fluctuations attributable to doping-related variations in effective channel length. Further, the transistor design affords better source and drain conductance when compared to prior art FinFETs. Two representative embodiments of the key structure are described in detail.

Figures 2A, 2B, 2C, 2D:
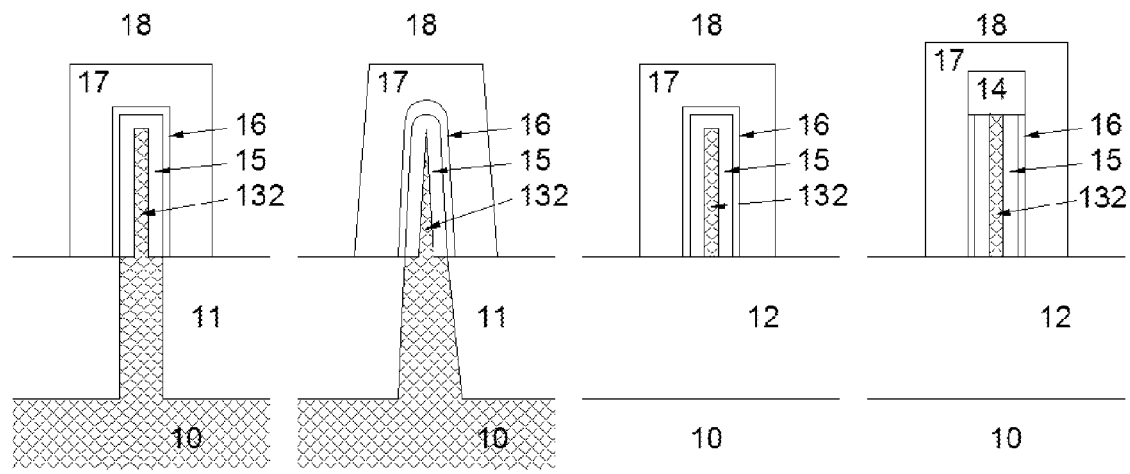
FIGS. 2a-2d present the schematic cross sections of four FinFETs realized according to an embodiment, representing the regions of their gates.

FIGS. 2a-2d are exemplary and non-limiting schematic cross-sections taken through the active channel region of similar FinFETs in accordance with the invention, also referred to herein as a transistor or transistors as the case may be, that include the improvements described herein according to an embodiment. These sections are perpendicular to current flow, and they represent the region beneath the gate in the active channel. Each of transistor differs from the prior art in having a composite fin. The center of each fin is a highly doped core 13, and this core is surrounded by an undoped or very lightly doped epitaxial layer 15, which is referred to herein as the Channel Epitaxy. The doping of the core is P-type for an NMOS transistor and N-type for a PMOS transistor. Further, the doping density of the fin cores provides one more variable that can be used to fix the threshold voltage to a desired value. In general, the core doping is used to increase the threshold voltage. Furthermore, FIGS. 2a-2d also show four different realizations of embodiments; FIG. 2a with a fin that is connected to the substrate and a three-sided gate; FIG. 2b with a triangular fin connected to the substrate; FIG. 2c with a silicon on insulator (SOI) fin having a three-sided gate; and, FIG. 2d with an SOI fin having a two sided gate that is effective only on the vertical walls of the fin.

To clarify the cross-sections, additional explanation is provided with respect of FIG. 2a, that depicts a TriGate transistor in which the fin core 132 is connected to the substrate 10, penetrating through the isolation oxide 11. The doped fin core 132 is surrounded by an undoped or very lightly doped epitaxial layer 15, the Channel Epitaxy. Region 16 covering the Channel Epitaxy 15 is the gate dielectric, which is typically a high-K dielectric stack, meaning that its effective dielectric constant is, typically, greater than 6. The gate electrode 17 is normally a metal, metal alloy, or a metallic compound (hereafter simply "metal") chosen for its work function. Finally, region 18 is a deposited material, typically amorphous silicon, which provides connection to and protection for the metal gate 17. The threshold voltage of this class of transistor is mainly determined by the doping of the fin core 13, by the thickness of the undoped layer 15, by the thickness and dielectric constant of the gate stack 16, and by the work function of the gate conductor 17.

As would be readily understood by an artisan, the teachings herein provide the benefits of epitaxial transistors that complement the basic prior art FinFET processes. It should be understood that there are a plurality of ways to implement the epitaxial FinFETs taught herein, each providing its specific benefits. In the descriptions that follow, it will be assumed that standard FinFET processing is prior art and understood.

Two specific embodiments are described below which realize the profiles shown in FIGS. 2a-2d in the active channel region. For purposes of simplicity, the most appropriate reference profiles are those shown in FIGS. 2a and 2c for bulk FinFETs and SOI (Silicon On Insulator) FinFETs respectively. Each embodiment addresses the creation of the respective channel doping profile late in the process.

In the FinFET class of technologies, the immediate transistor substrate is typically an array of fins. This is illustrated in exemplary and non-limiting FIG. 3, which shows an array of four fins 131 formed from a single crystal silicon substrate 10. The space between the fins is filled with an isolating dielectric 11. In a typical prior art FinFET structure, each fin 131 has a width of 5 nm to 15 nm, and is very lightly doped. According to an embodiment, the fins 131 are thicker, between 15 nm and 50 nm. A similar structure, except for its being fabricated in SOI technology, appears in exemplary and non-limiting FIG. 4, where the substrate 10 is covered by a buried oxide 12. The single crystal fins 131 are isolated because they rest on the buried oxide 12. Again, in conventionally fabricated SOI FinFETs, the fins 131 are 5 to 15 nm wide, but according to an embodiment, they are 10 nm to 50 nm wide.

Exemplary Embodiment 1

Figure 5:
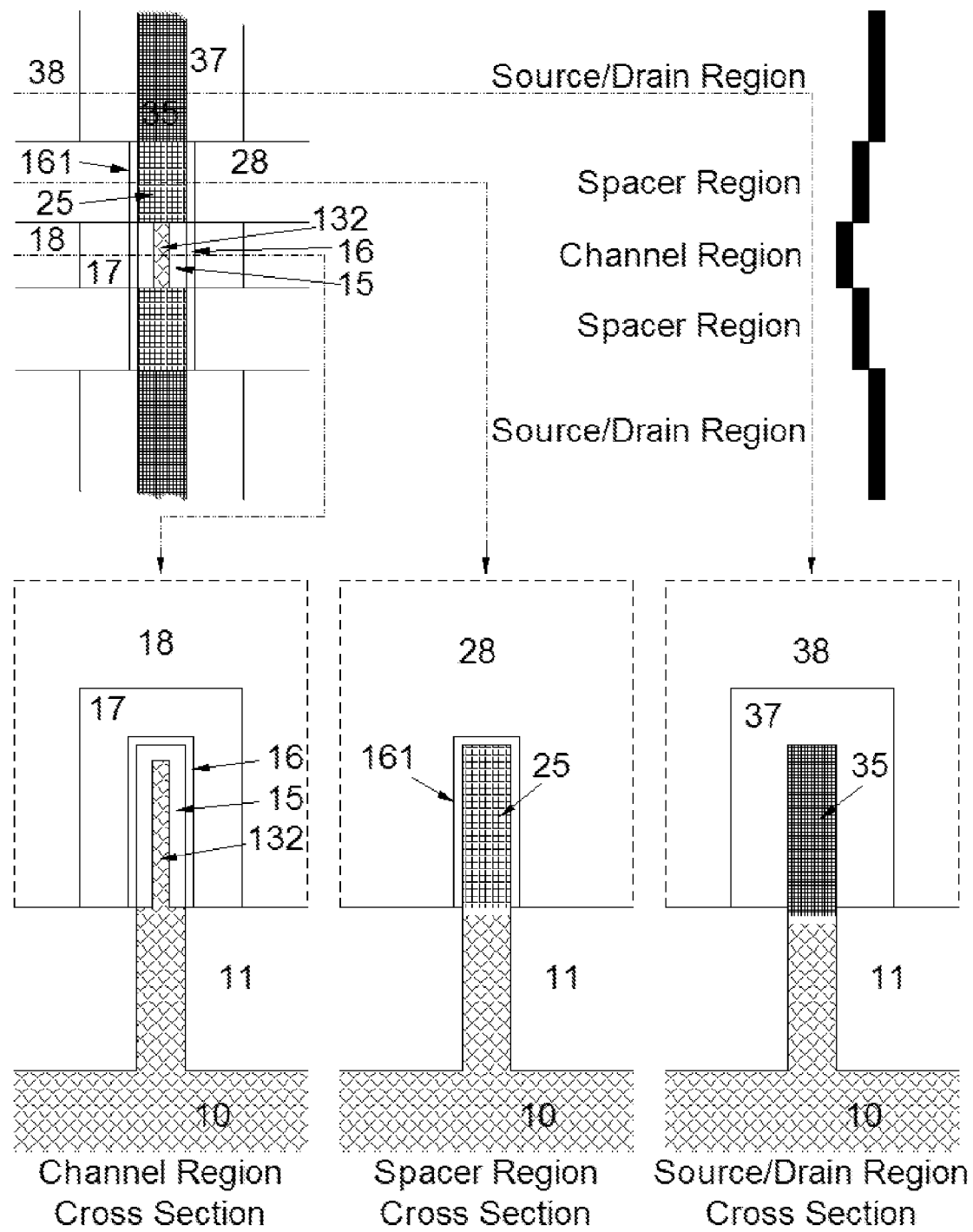
FIG. 5 is a schematic representation of a structure of three cross-sections of a completed bulk FinFET representing the channel, spacer and source/drain regions according to an embodiment.

A first embodiment addresses the case where the fins are formed from the bulk substrate. The completed structure is schematically illustrated in exemplary and non-limiting FIG. 5, which shows cross-sections from three regions of a representative fin of a FinFET. For orientation purposes, the top part of FIG. 5 is a schematic cross section of a transistor fin, in a plane parallel to the substrate. The topmost region, identified as the Source/Drain Region with elements 35, 37 and 38, represents either the Source or Drain region of the fin. Beneath that is the Spacer region, identified as the Spacer Region with elements 25, 161 and 28. Finally, the Channel region is shown identified as the Channel Region with elements 132, 15, 16, 17 and 18. All of the listed elements will be discussed in detail below. The bars at the right are intended to help localize the various regions. The more important parts of FIG. 5 are the three cross-sections from the Channel Region, the Spacer Regions and the Source/Drain Regions. These cross-sections are described in greater detail herein in order to make clear both the structure and its respective manner of fabrication. As in FIGS. 2a-2d, these cross-sections are perpendicular to the direction of current flow. The left most cross-section shows the active channel region of the transistor. This illustration is equivalent to FIG. 2a. The whole structure is formed on a substrate 10, which is normally p-type silicon for NMOS transistors and n-type silicon for PMOS transistors. The element marked 10 could also be a well doped appropriately for the transistor type. The individual fins are isolated by dielectric regions 11, which are typically silicon dioxide. Both the isolation 11 and the substrate or well 10 must be understood to extend in both directions parallel to the substrate 10.

In the Channel Section cross-section each fin is a composite consisting of a fin core 132 and a channel region 15. The fin core is 5 nm to 15 nm wide, and it is doped to help set the threshold voltage. For NMOS transistors, the core 132 is doped with acceptors, like boron or indium, to a density ranging from $1 \times 10^{17}$ ions/cm$^3$ to $1 \times 10^{20}$ ions/cm$^3$. For PMOS transistors, the core 132 is doped with donors, like phosphorus, arsenic or antimony, to a density ranging from $1 \times 10^{17}$ ions/cm$^3$ to $1 \times 10^{20}$ ions/cm$^3$. The fin core 132 is covered with a single crystal region 15 having very light doping, nominally zero, but certainly less than $1 \times 10^{17}$ ions/cm$^3$ and preferably less than $1 \times 10^{16}$ ions/cm$^3$. This single crystal region 15 has a thickness of 5 nm to 15 nm, and it may be epitaxial silicon, epitaxial silicon:germanium, or any other semiconductor which can be grown epitaxially on the underlying fin core 132. There is a gate dielectric or gate dielectric stack 16 covering the epitaxial channel region 15, and adjacent to the gate dielectric 16 is the gate electrode 17. In the generations of transistors for which this structure is appropriate, the gate dielectric 16 is normally a high-K stack, having an effective dielectric constant in excess of 6. The gate electrode 17 for these same generations is normally a metal or metallic compound chosen for its work function to establish, with the doping of the fin core 132, the desired threshold voltage. While TiN is a common choice, hafnium, ruthenium, TaN, MoN and WN are among the non-limiting candidates for this role. The transistor channel region is completed by a gate handle 18, which provides both protection and electrical contact to the metal gate 17. The gate handle 18 is typically amorphous silicon doped to achieve high conductivity. The dashed lines around region 18 indicate that the extent of that material is larger than the scale of this cross section.

The next cross section, identified as "Spacer Section", represents the region between the active channel and the highly conductive source or drain. The dominant feature here is the spacer 28, typically formed by anisotropic etching of a silicon nitride layer that has been deposited by chemical vapor deposition or PECVD. The common features are the substrate 10, reaching up to the fin, and the isolation oxide 11. Region 25 is doped with donors for NMOS transistors or acceptors for PMOS transistors. It provides a conductive path between the active channel region 15 of the transistor and the heavily doped source/drain regions 35. The spacer 28 limits the diffusion of donor atoms from the extremely heavily doped source or drain regions in the channel region in order to allow control of the threshold voltage. NMOS transistor architecture includes doping that converts region 25 to n-type to allow conduction of electrons from source or drain 35 to the channel region 15 through the extension region 25. The n-type doped region 25 and acceptor doped region 132 in an NMOS transistor form a P-N junction. The conductive region 25 is frequently called "drain extension." For a PMOS transistor, the doping senses are reversed, with the fin core 132 doped with donors and the drain extension 25 doped with acceptors. Region 161 is a protective or screen oxide residue from early stages of processing this fin. The dashed lines around region 28 indicate that it is large with respect to the scale of this drawing.

The third cross-section is identified as "Source/Drain." Here, the transistor currents are connected with the balance of the integrated circuit. The substrate 10 and isolation oxide 11 are common, but the region 35 is extremely highly doped in order to maximize its conduction. This region is doped with donors for NMOS transistors and acceptors for PMOS transistors. Other measures are frequently taken to further enhance the conductance of the source and drain regions. In one embodiment, suggested by region 37, highly doped epitaxial silicon or silicon:germanium enlarges the cross-section and the overall conductivity of the source and drain regions. In this case, region 35 acts as a seed for the epitaxial growth. A common alternative method of enhancing conductivity is forming a metallic silicide over the surface of the highly doped region 35. Nickel silicide is frequently used, formed by the solid-solid reaction between metallic nickel and the underlying silicon. The entire source/drain region is surrounded by interlayer dielectric 38, typically PECVD glass, sometimes lightly doped with phosphorus. Again, the interlayer dielectric 38 is large compared to the scale of this drawing, as suggested by dashed line boundaries.

Figure 6:
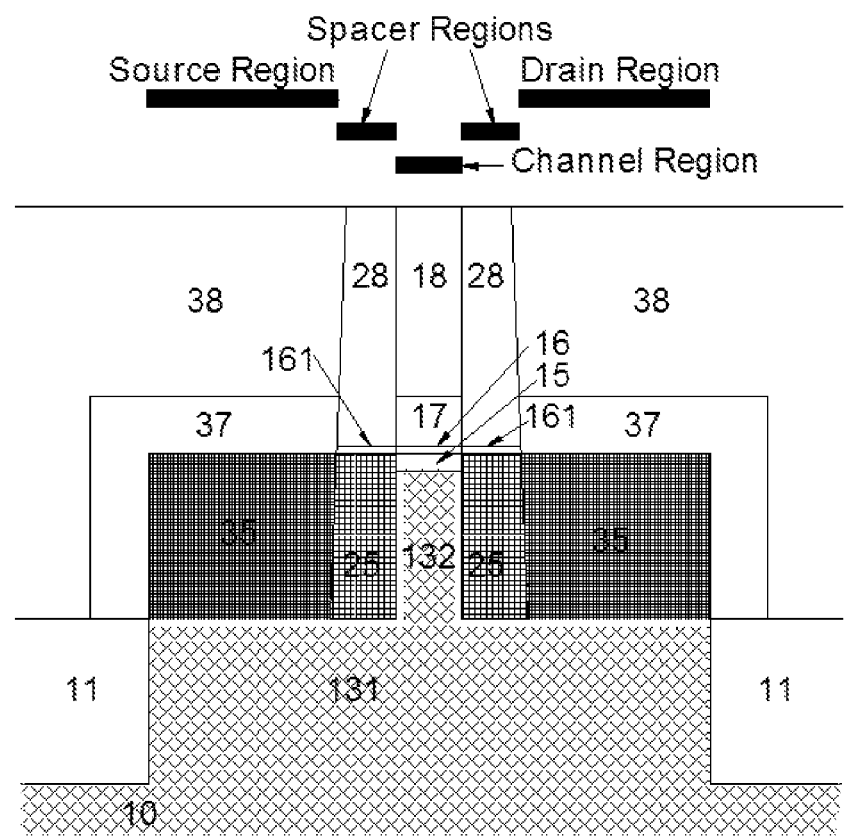
FIG. 6 is a schematic representation of the cross-section of the fin in a vertical plane parallel to the direction of current flow in the fin, taken through the centers of the channel, drain extension and source/drain regions of the transistor being described.

FIG. 6 shows a schematic cross section of the improved FinFET, representing features in a vertical plane parallel to the direction of current flow in the fin, taken along the central axis of the transistor fin, passing directly through the center of the channel region, i.e., through the center of the fin core 132, through the center of the drain extensions 25 and through the center of the source/drain portions of the fins 25. At the top of FIG. 6, the bars are intended to assist the eye in identifying the various regions of the FinFET transistor. The substrate 10, doped with a first dopant type is separated from the device structures by dielectric 11, except where it extends to form the fin structures 25 and 35, plus the fin core 132. That portion of the substrate 131 that extends upward through the isolation 11 is representative of the original fin prior to the processing that created the fin core 132 and the doped regions 25 and 35. The drain extension regions 25 and the heavily doped source and drain regions 35 are doped with the opposite class of dopant compared to the fin core 132. Thus, for an N-type FinFET, region 132 will be doped with acceptors and regions 25 and 35 will be doped with donors. The n-type and p-type regions are separated by depletion layers. To enable better conduction and contacting for the sources and drains 35, region 37 is a heavily doped epitaxial layer.

In this view, only a small portion of the undoped channel epitaxial layer 15 is shown. That layer is beneath the gate dielectric structure 16, a work-function controlled gate 17 and the conductive gate handle 18.

Spacers 28 define the length of the channel 15 by their separation, and they also define the extent of the drain extensions 25 by their width. This is because the gate spacers 28 are used as hard masks in forming both those regions. The residual protective oxide 161 remains only beneath the spacers 28.

Finally, the first interlayer dielectric 38 surrounds the balance of the transistor fins. It also has an extent which is large compared to the features in the drawing.

Figure 7:
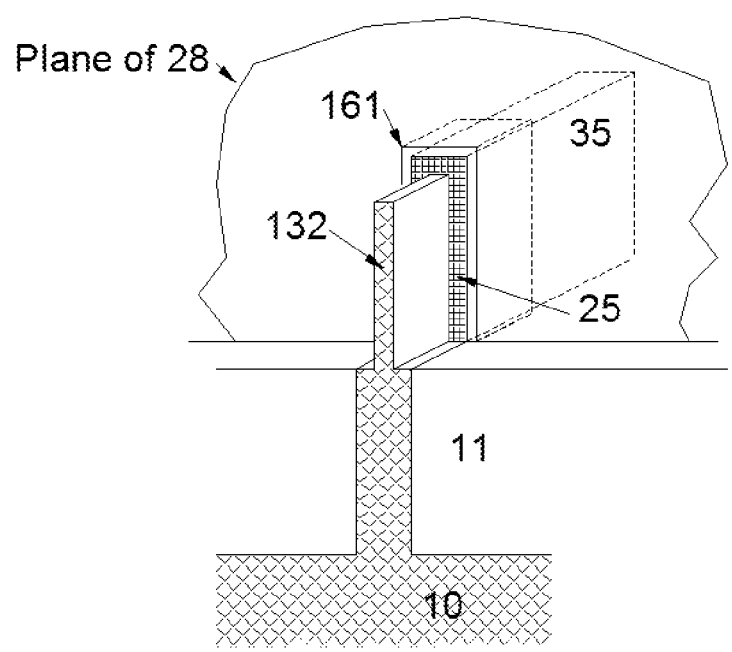
FIG. 7 is a schematic perspective view of the FinFET transistor at the point where the fin core has been defined by an etch step.

FIG. 7 shows a perspective and cross section representation of the structures in FIGS. 5 and 6 above, viewed from within the active channel region, at a critical point in the processing, corresponding to FIG. 8*i* below. The substrate 10, doped with a first dopant type is separated from the device structures by dielectric 11, except where it extends to form the fin core 132. At this stage, the fin core has been etched to its final thickness, masked by the spacer 28. Adjacent the fin core 132 lies the drain extension 25, which is doped with a second dopant type, opposite to that of the substrate 10 and the fin core 132. Beneath the spacer 28, the drain extension portion of the fin 25 is surrounded by a protective or screen oxide 161. More remote from the channel region, there is a very heavily doped source or drain region 35, having the same conductivity type as the drain extension 25. In general, region 35, lying outside the spacer, will have its conductivity enhanced by a highly conductive epitaxial layer, not shown in this diagram.

In subsequent processing steps, the fin core 132 will be covered with an undoped channel epitaxial layer that matches the contour of the drain extension 25. After that, the channel will be covered by a gate dielectric stack, followed by a gate of controlled work function and a highly conductive gate handle. The relevant steps are detailed in FIGS. 8*j*, 8*k* and 8*l*.

In order to demonstrate one method of creating the structures in FIG. 5, exemplary and non-limiting FIGS. 8*a*-8*l* are organized to show processing in the same three regions, Channel, Spacer and Source/Drain.

Figure 3:
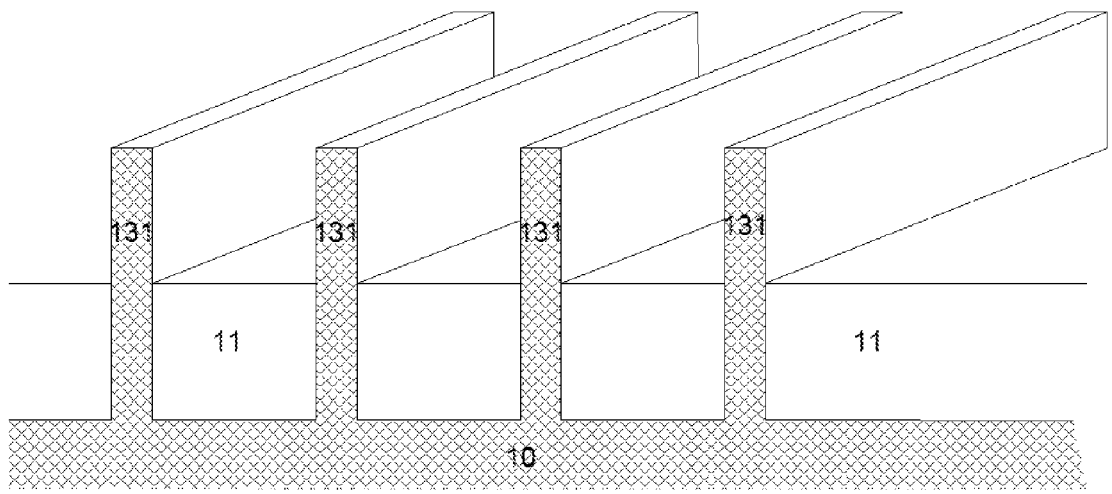
FIG. 3 is a schematic representation of a bulk FinFET substrate according to an embodiment.
Figure 8A:
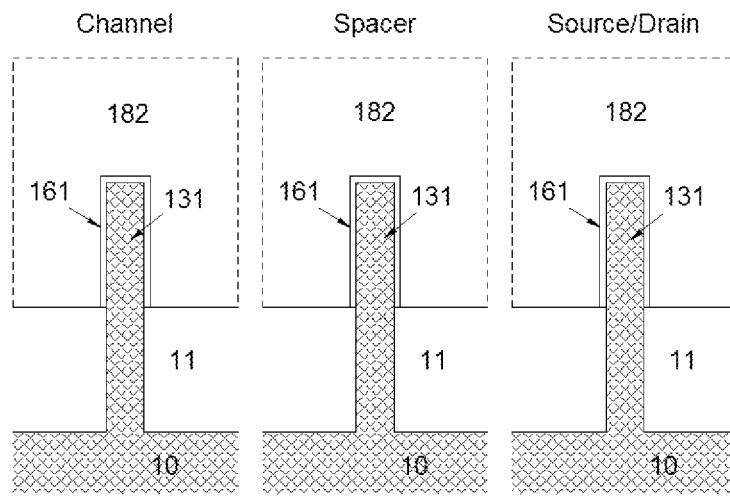
FIGS. 8a-8l schematically illustrate an embodiment for realizing the improved FinFET on bulk silicon, where each drawing consists of three cross-sections representing the channel, spacer, and source/drain regions of the improved FinFET.

The starting material for this embodiment carries arrays of fins 131 as suggested by FIG. 3, but the fins in this case are wider than classical fins. Hence, rather than having fins which range from 5 nm to 15 nm in width, the fins according to the embodiment range from 15 to 50 nm in width. In FIG. 8*a*, the initial fins 131 are connected to the substrate 10 and separated by isolating dielectric 11. They are oxidized to form a protective or screen oxide 161. Further, they are covered by amorphous or polycrystalline silicon 182. This layer 182 is normally formed by chemical vapor deposition, and it may be planarized by chemical-mechanical polishing (CMP). Apart from the width of the fins 131, these process steps are representative of normal FinFET processing.

Figure 8B:
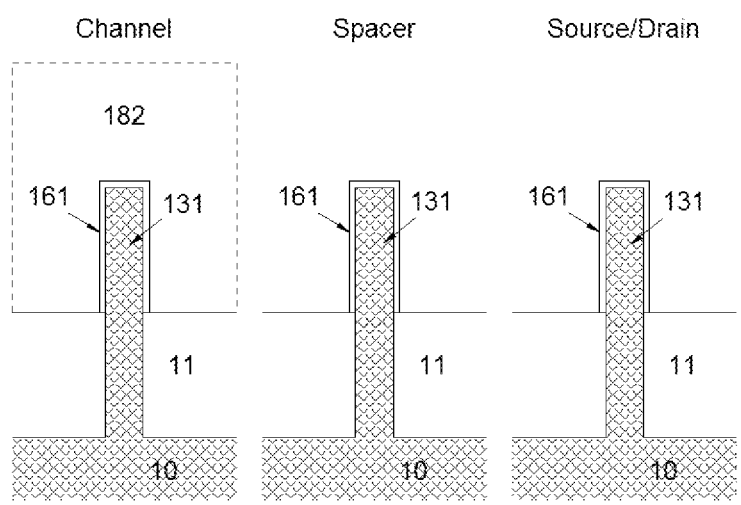

FIG. 8*b* shows the next stage in which the channel region is defined by photolithography, leaving a sacrificial gate 182 which defines the channel length of the transistor being formed. The gate material 182 has been removed from both the spacer and source/drain regions. While the oxide 161 may be removed from the fins in the spacer and source/drain regions at this stage, it is more typically retained. These process steps are representative of normal FinFET processing.

Figure 8C:
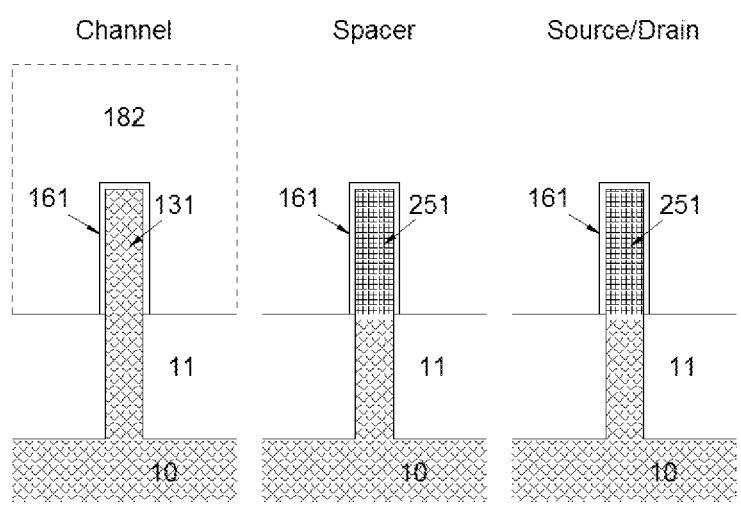

FIG. 8*c* shows that the fins in the source/drain and spacer regions are implanted with the elements that will form the drain extension 251. For NMOS transistors, this doping uses donors like phosphorus or arsenic. For PMOS transistors, the doping uses acceptors like boron or indium. In either case, the doping level for 251 has to be large enough to completely overcome the doping initially in the fins 131, and to provide efficient conduction to and from the channel region after the spacers 28 have been formed. At this stage, the fin 131 in the channel region is protected from the implant 251 by the sacrificial gate 182. These process steps are representative of normal FinFET processing.

Figure 8D:
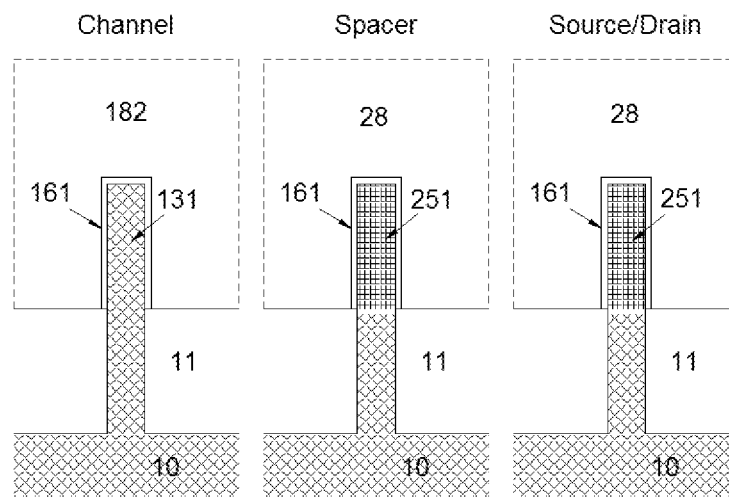

FIG. 8*d* shows the first stage of spacer formation, where the spacer material 28 is deposited by chemical vapor deposition (CVD) or by plasma enhanced CVD. This spacer material is typically silicon nitride, and its deposited thickness is a major determinant of the eventual length of the spacers 28 parallel to the direction of current flow. While the spacer length is not a critical element of this invention, the silicon nitride in this case may typically be deposited to a thickness of 20 nm to 200 nm. These process steps are representative of normal FinFET processing.

Figure 8E:
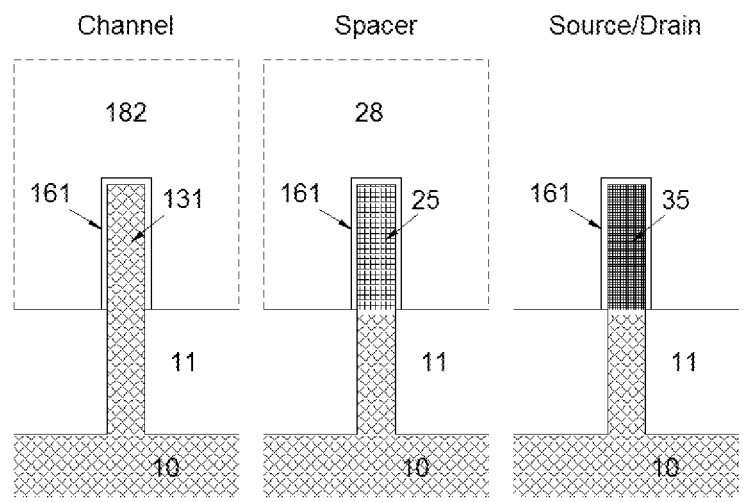

FIG. 8*e* shows the consequence of anisotropic reactive ion etching (RIE) of the spacer material 28. It is cleared from the planar regions of the wafer and from the fins 35, but it remains on the faces of the sacrificial polysilicon gate 182. This stage also shows another implant step, this time doping the source/drain region 35 heavily with donors for NMOS transistors or acceptors for PMOS transistors. During this implant step, the channel region 131 is protected by the sacrificial gate 182 and the drain extension 25 is protected by the spacer 28. At this stage, the implants 25 and 35 are annealed to activate the conductivity of those regions. These process steps are representative of normal FinFET processing.

Figure 8F:
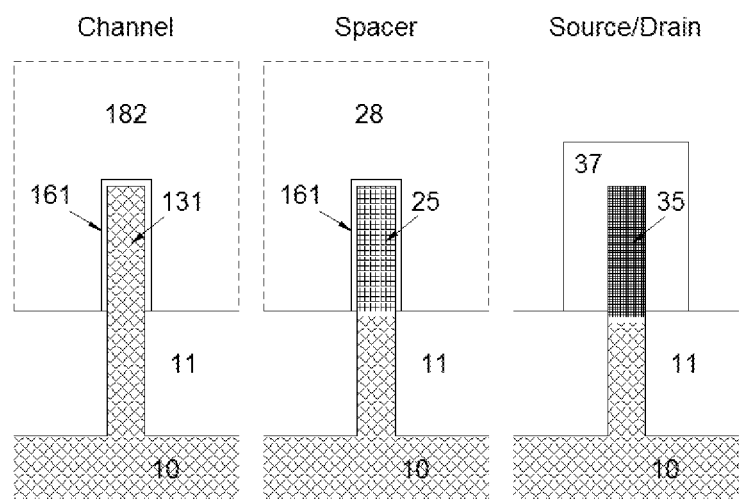

FIG. 8*f* addresses enhancing the conductivity of the source and drain regions. First, the protective oxide 161 must be removed from the source/drain 35. Then its cross section may be increased by growing epitaxial silicon or silicon:germanium 37, which is also doped to achieve high conductivity and low contact resistance. Again, its doping is done with donors for NMOS and acceptors for PMOS. An alternative method of enhancing the conductivities in this region is by reacting the silicon with a metal like nickel. In every case the channel region is protected by the sacrificial gate 182 and the spacer region is protected from these materials by the spacer 28. These process steps are representative of normal FinFET processing.

Figure 8G:
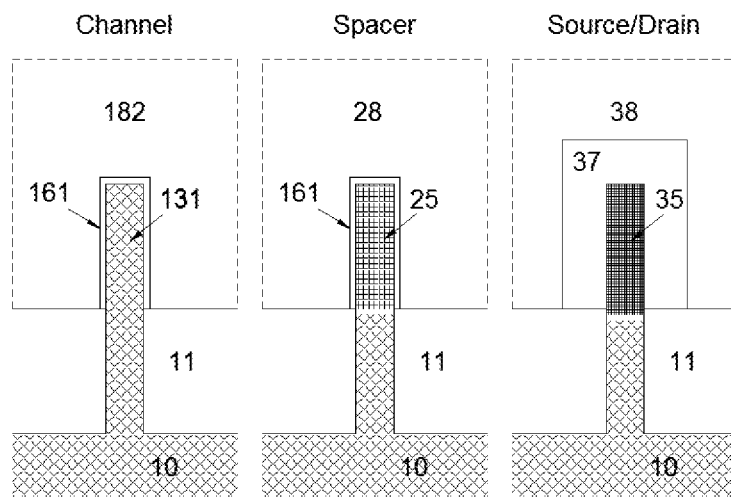

FIG. 8g shows the addition of the interlayer dielectric 38, frequently called ILD. This is normally done with plasma enhanced CVD, or PECVD. The dielectric material is normally silicon oxide, although it may be lightly doped with phosphorus, boron or both. This dielectric is planarized by chemical-mechanical polish (CMP) in a way that presents the sacrificial gates 182 at the surface of the wafer. The tops of the spacers 28 will also normally be cleared. These process steps are representative of normal FinFET processing.

Figure 8H:
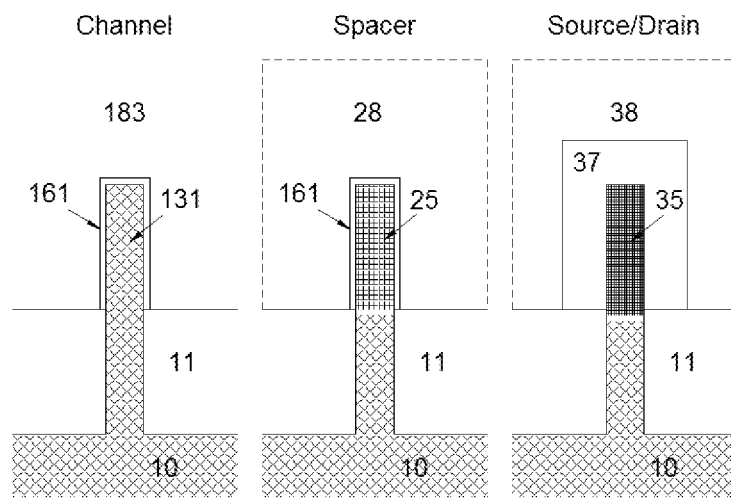

FIG. 8h shows the next step, a normal component of Gate Last transistor processing. The sacrificial gate 182 is etched away leaving a cavity 183. The balance of the transistor is protected either by the spacers 28 or by the ILD 38. The cavity 183 is bordered on its sides by the spacers 28, and more remotely and perpendicular to the spacers, it is bordered by ILD 38. Thus, the next few steps are executed in a trench shaped hole.

Figure 8I:
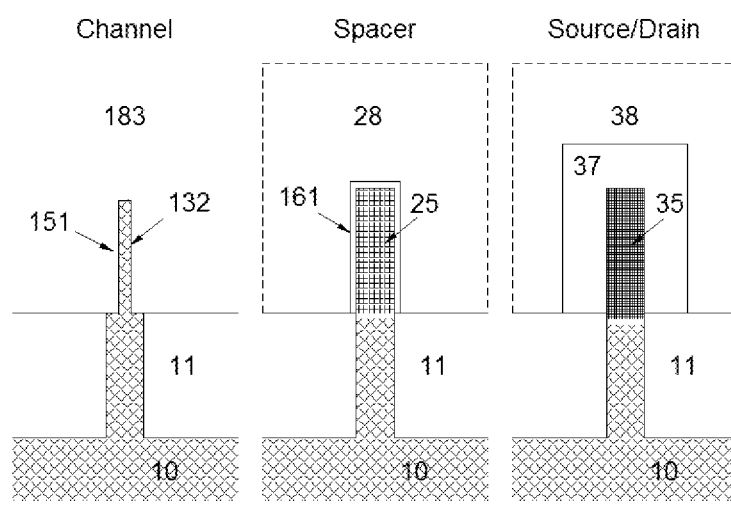

FIG. 8i shows a step that is unique to this structure of an embodiment of a FinFET. After etching and clearing the protective oxide 161, the initial fin 131 is etched leaving a fin core 132, typically 5 to 15 nm wide and a recess 151. The recess 151 is 5 nm to 15 nm deep. When the recess is etched, the Spacer region is protected by the spacer 28, and the Source/Drain region is protected by the ILD 38. Further, it is preferred that the etching method for the recess 151 is anisotropic so the walls of the recess 151 are coplanar with the interior faces of the spacers 28 perpendicular to the direction of the current flow.

Figure 8J:
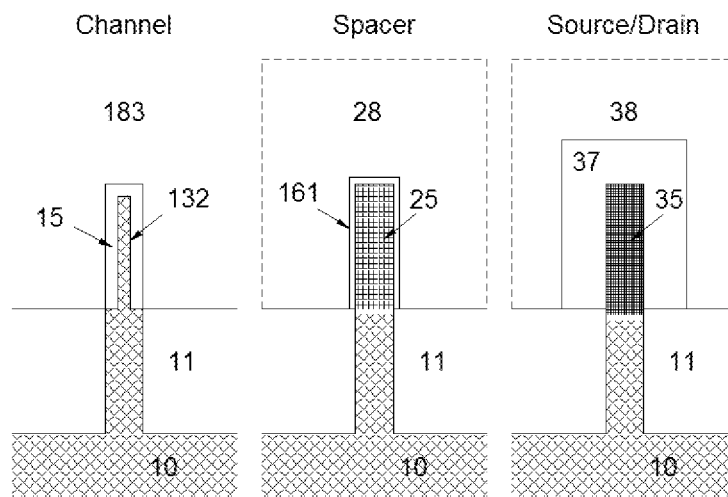

FIG. 8j is also key to this improved structure of an embodiment of a FinFET. Using a selective epitaxial process, undoped or lightly doped single-crystal semiconductor 15 is grown in the recess 151, to a thickness of 5 nm to 15 nm so it sheathes the fin core 132. While silicon may be the preferred semiconductor to form the sheath 15, other semiconducting materials can be used. The most common alternative is silicon:germanium, but for this thin epitaxial layer selected III-V semiconductors may also be considered. This epitaxial sheath 15 is the region that supports the conductive channel of the FinFET, and it is referred to as the channel region or the channel epitaxy.

According to an embodiment the sheath 15 has some key characteristics associated thereto. First, it has to have very low doping, less than $1 \times 10^{17}$ ions/cm$^3$ and preferably less than $1 \times 10^{16}$ ions/cm$^3$. Second, the efficacy of this structure's reduction of threshold variations associated random doping fluctuations is strongly dependent on the doping gradient between the fin core 132 and the sheath 15. Consequently, the temperatures to which the core 132 and sheath 15 are exposed must be kept to a minimum. The source/drain 35 and drain extension 25 implants have to be activated before the sacrificial gate is cleared, as discussed in connection with FIG. 8e. This means that the selective epitaxial process per se must be done at a low temperature, 650° C. or cooler. Because this is a MOS device, the gate induces a conductive layer within the sheath 15. This imposes the requirement that the sheath 15 or channel epitaxy is formed after all high temperature steps are completed, not only for the fabrication of the FinFET, but for any integrated circuit in which it is used.

Figure 8K:
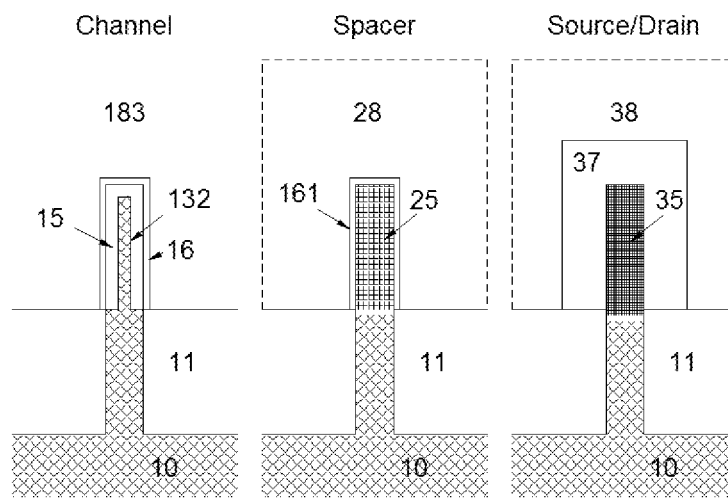

FIG. 8k shows that the sheath 15 is covered with a gate dielectric 16. For this class of transistor, the gate dielectric 16 may be expected to be, but is not limited to, a stack that includes at least one layer of a high-K dielectric, so that the effective dielectric constant K of the stack is in excess of 6. Typically, high-K dielectric stacks comprise oxides or nitrides of hafnium, frequently deposited by atomic layer deposition. The formation of high-K dielectrics in FinFET configurations is well known practice.

Figure 8L:
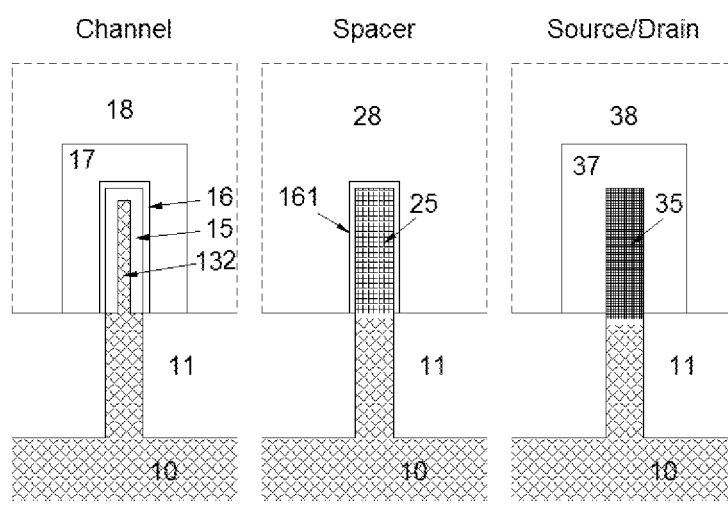

FIG. 8l shows the completion of the improved FinFET using common Gate Last practices, including the deposition of a metallic gate 17 over the high-K dielectric stack 16. Metallic gates may be commonly recognized metals like Ta and Nb, but they are frequently metallic compounds like TiN, TaN, and RuO$_2$. The gate metals are chosen for their work functions because transistor threshold voltages directly reflect the gate work functions. After depositing the metal gate 17, a gate handle 18 is deposited. The gate handle 18 provides electrical contact to the metal gate 17 and protects it. The gate handle 18 refills the cavity 183 within which the prior steps have been executed. These process steps are representative of normal FinFET processing, with the caveat that temperatures in excess of 650° C. must not be used.

Because the sequence represented by FIGS. 8k and 8l involve non-selective deposition processes, the top surface of the interlayer dielectric 38 is covered with conductive materials. It is necessary to use a process such as, but not limited to, CMP to return this surface to its clear and non-conductive state. Further, to complete the fabrication of an integrated circuit, a second ILD will be deposited, contacts will be formed to make connection to the sources, gates and drains of all the transistors, and the circuit will be provided with multiple levels of interconnection as needed.

While the steps above have been described to reflect fabricating just one class of FinFET, either NMOS or PMOS, normal processing addresses both to create CMOS integrated circuits, so some of the steps above are performed twice with differing materials like dopants and metals. Further, the FinFETs as described herein can be integrated with traditional planar processing as long as all high temperature steps are completed before selectively growing the epitaxial layers 15 in the recesses 151.

Figure 9:
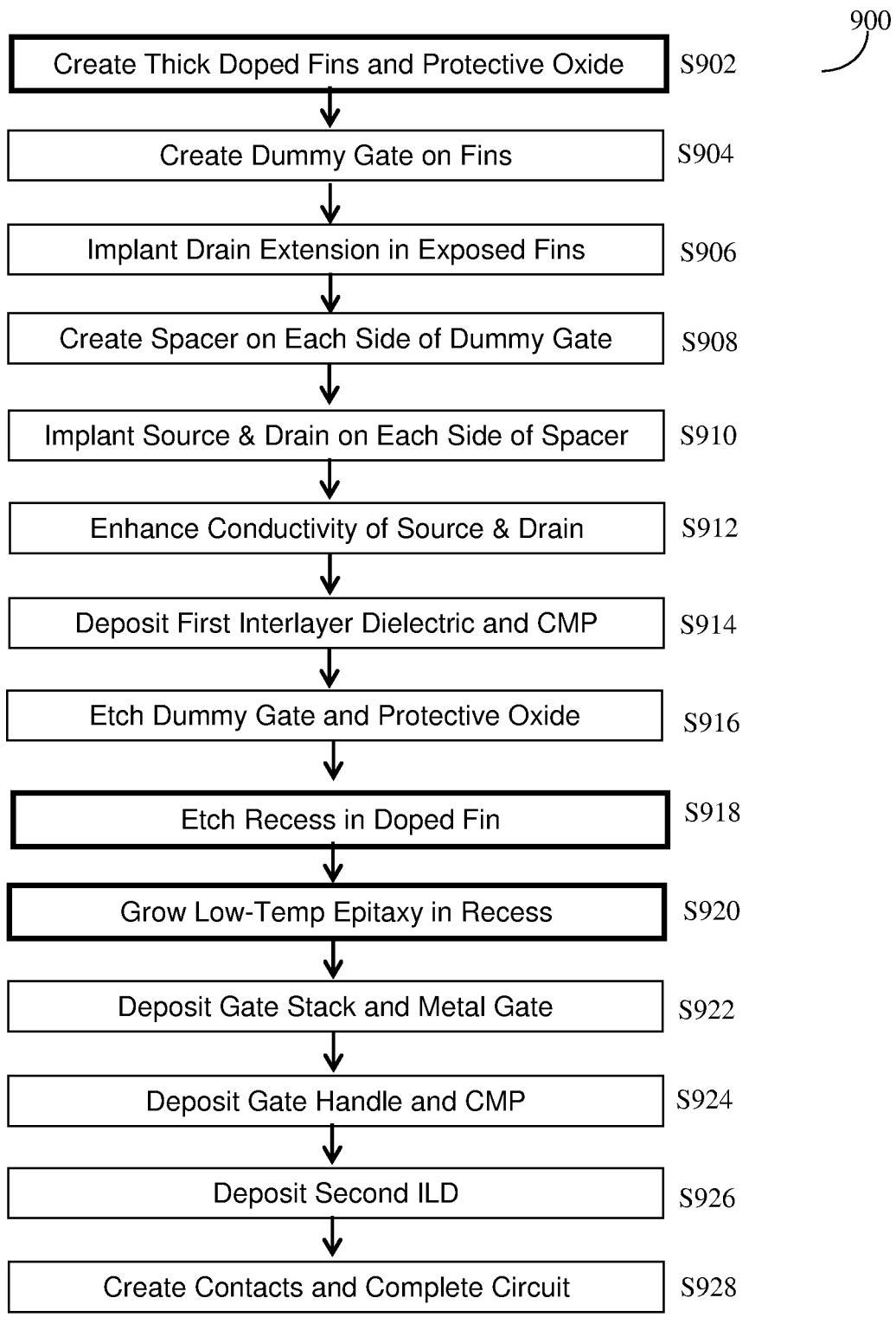
FIG. 9 is a flowchart of steps for realizing the FinFET with a spatially confined channel according to an embodiment.

FIG. 9 shows an exemplary and non-limiting flowchart 900 of the steps described above with respect of FIGS. 8a-8l. The starting step S902, manufacturing thick fins with a doping density designed to target the desired threshold voltage is unique to this invention. These fins normally have a thin protective oxide. On these fins, it is necessary to first form a dummy gate, which defines the final channel length. Using the dummy gate as a mask, the drain extensions (and source and drain) are implanted in the fins external to the dummy gate. The spacers are formed by a sequence of dielectric deposition and anisotropic etching. After the spacers are complete, the sources and drains are heavily doped in the regions external to the dummy gate and the spacers, and then any conductivity enhancement for the sources and drains, epitaxy or silicide, is fabricated. Etching away the dummy gate and the underlying protective oxide exposes the underlying doped fin. In order to realize the unique device structure, in S918 a recess of typically 10 nm is etched in the fin, using the faces of the spacers as a hard mask. Straggling portions of the drain extension 25 are also etched away in this step. In S920, the recess is uniquely refilled with undoped or very lightly doped epitaxial silicon or silicon:germanium forming a sheath over the fin core, which supports the FinFET channel. In order to preserve the abrupt doping gradients, this epitaxial deposition has to be processed at a very low temperature, less than 650° C. The process now returns to, for example, a normal Gate Last sequence, including the deposition of a gate dielectric stack and a metal gate. Then the gate handle, typically doped amorphous silicon is deposited. A CMP step restores the insulating surface of the first interlayer dielectric, and that is followed by depositing a second interlayer dielectric. In S928 contacts are formed, and the interconnection of the transistor with the balance of the integrated circuit is completed. One of ordinary skill in the art would readily appreciate that the modification of a FinFET with S918 and S920 may be adapted for use in other FinFET processes without departing from the scope of the invention.

Exemplary Embodiment 2

Figure 4:
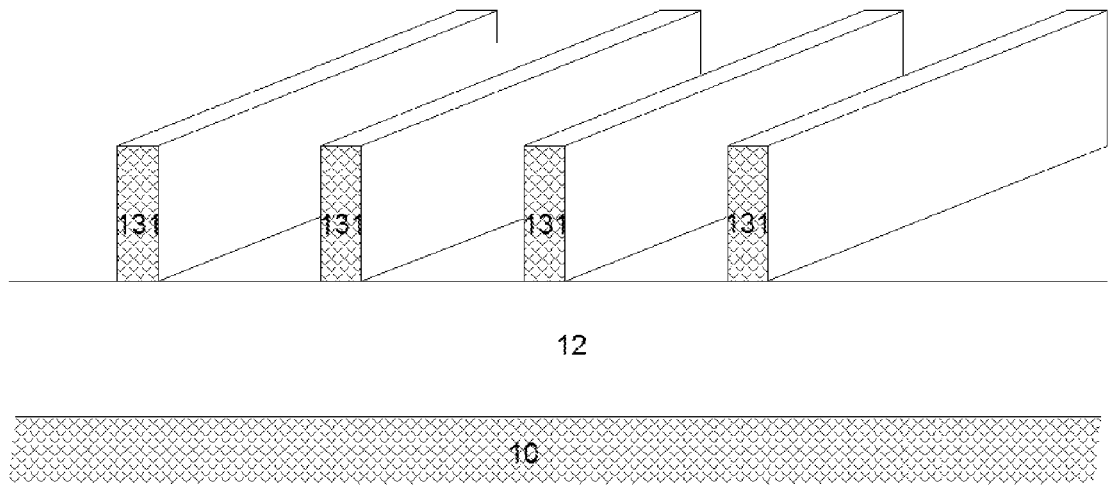
FIG. 4 is a schematic representation of an SOI FinFET substrate according to an embodiment.

The second embodiment addresses the case where the FinFETs are formed on an insulating substrate, as suggested by FIG. 4, where the fin material 131 is on top of a buried oxide 12, with physical support coming from the substrate 10. Whereas prior art fins 131 have a width of 5 nm to 15 nm, for the purposes of an embodiment of this invention, the fins are 15 to 50 nm wide. Further, the fins are doped with acceptors to form NMOS transistors or with donors to form PMOS transistors, and the doping densities are typically in the range of $1 \times 10^{17}$ ions/cm$^3$ to $1 \times 10^{20}$ ions/cm$^3$.

Figure 10A:
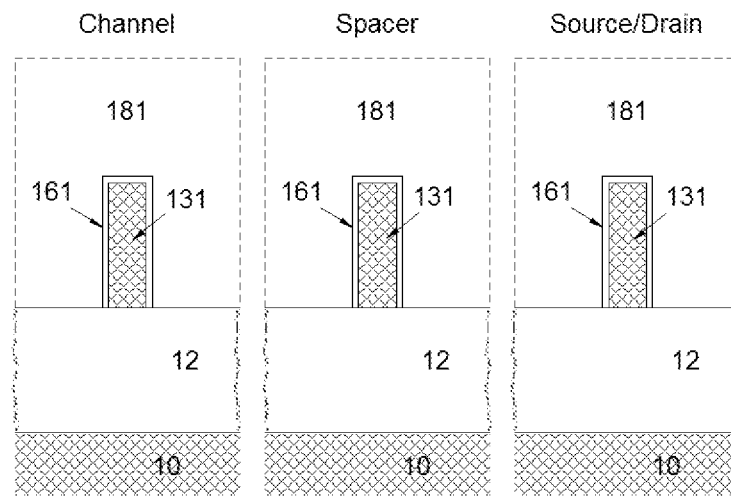
FIGS. 10a-10b schematically illustrate the starting and finishing cross-sections for the improved FinFET fabricated as an SOI transistor according to an embodiment.

Apart from the difference in the initial fin configuration, the processing of the second embodiment is identical to that of the first embodiment. For that reason the explanation is provided using two figures. FIG. 10a shows the initial steps, which include the formation of a protective oxide 161 over the fins 131 and the deposition of amorphous or polycrystalline silicon 182 over the entire wafer.

Figure 10B:
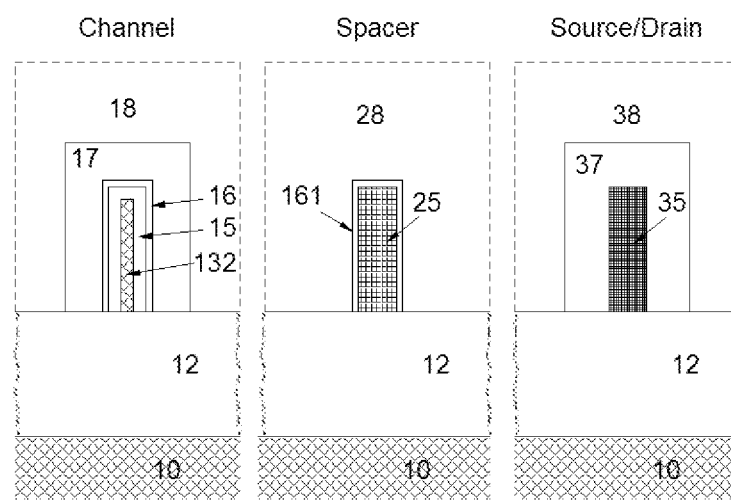

The overall process proceeds as before to realize the structure illustrated in FIG. 10b, where the substrate 10 is separated from the transistors by a buried oxide 12. The Channel region has the most structure, starting from the fin core 132, which is sheathed by the near-zero doped, selective epitaxial layer 15. This layer is grown in a recess identified as 151 in FIG. 8i. As before, the boundaries of the recess 151 and therefore the epitaxial layer 15 are essentially coplanar with the faces of the spacers 28. The epitaxial layer 15 is separated from the metal gate 17 by a high-K gate dielectric stack 16. The Channel region is completed with a gate handle 18, which provides electrical connection and physical protection to the underlying elements.

The Spacer region in FIG. 10b is dominated by the spacer 28, typically silicon nitride. The current path between the channel and the source or drain is the implanted region 25, which correlates with the structures normally known as drain extensions in planar transistors. Region 25 is doped with donors for NMOS transistors or with acceptors for PMOS transistors. The layer 161 is residual protective oxide from FIG. 10a.

Finally, the Source/Drain region in FIG. 10b consists of the very heavily doped fin 35, doped with donors for NMOS or acceptors for PMOS, and a conduction enhancing structure 37, illustrated as a selective epitaxial enhancement to the fin 35. This is all protected by the first interlayer dielectric 38.

One practical use is in a CMOS process that involves the creation of both NMOS and PMOS devices. Some of the processing steps are necessarily different reflecting at the very least differing doping species and should not be viewed as being outside of the scope of the invention. Other processing steps may be shared.

A practical integrated circuit is typically completed with a second interlayer dielectric, contacts to gates, sources and drains, and multiple layers of interconnect. Further, these devices may be integrated with planar MOSFETs on the same substrate. In combining this improved SOI FinFET with other structures, it is important to complete all high temperature steps prior to selectively growing the epitaxial layer 15, which must also be done at a low temperature, not exceeding 650° C.

In either examples of the bulk Embodiment 1 or the SOI Embodiment 2, these FinFETs offer multiple advantages when compared to conventional FinFETs. These advantages include, but are not limited to:

a) Threshold variations associated with the random distribution of dopants is significantly reduced because of the physical separation of the gate dielectric 16 from the transistor doping in the fin core 13;

b) There are no doping-related channel-length variations in the lightly doped selective epitaxial layer 15 because the formation of the recess 151 eliminates tails from the Spacer region implant 25, which means that a serious source of threshold variations is eliminated;

c) The series resistance presented by the relatively slender drain extension 25 penetrating the spacer 28 is mitigated because the starting fin is roughly three times wider than starting fins found in the prior art, noting that this resistance is particularly destructive in the source circuit where it provides negative feedback; and/or, d) The series resistance of the source/drain regions is also reduced because the starting fins 131 are three times wider than their prior art counterparts.

e) Scattering of charge carriers by doping ions in the channel is eliminated, and this results in higher carrier mobility in the ON state, compared to a uniformly doped fin.

The principles were described above in their application to fins with three surfaces, which is to say as in FIGS. 2a and 2c. The same principles can be applied to triangular fins as shown in FIG. 2b or to capped fins as shown in FIG. 2d without departing from the scope of the invention. Note that FIG. 2d is an SOI configuration, but it has a bulk counterpart, to which these principles can also be applied.

Further, the key principles of this invention can be realized with fabrication sequences that differ from those described in the exemplary Embodiment 1 and exemplary Embodiment 2. In summary, but not by way of limitation, the improved FinFET is realized by using epitaxial deposition to create an un-doped or very lightly doped channel region in an etched recess in a doped fin. The boundaries of both the etch and the channel epitaxy are defined by the spacers that normally separate heavily doped sources and drains from FinFETs' channel regions.

Alternatively, the very low-doped epitaxial sheath can be grown over a doped fin without first creating a recess. This fabrication sequence would be simpler than that described in the first embodiment, but the advantages cited above would not be as significant. Also the drawings of the exemplary embodiments illustrate the thickness for the combination of the fin core 132 and the epitaxial layer in the channel region (FIGS. 2a and 8i) is the same as the thickness of the fin in the spacer regions and the source and drain regions. Though preferred, this is not a requirement of the present invention.

A person of ordinary skill-in-the-art would readily understand that the invention can be adapted for use in a plurality of ways, including integrated circuits where all transistors or a portion thereof are manufactured using the techniques disclosed hereinabove. Furthermore, although the invention is described herein with reference to two specific embodiments, one skilled-in-the-art will readily appreciate that other applications may be substituted for those set forth herein without departing from the spirit and scope of the present invention.

What is claimed is:

1. A FinFET transistor that reduces an effect of random doping fluctuations on a transistor's threshold voltage, the FinFET transistor formed of one or more fins, each fin comprising, in a direction of charge carrier flow, a source region, a first spacer region, a channel region, a second spacer region and a drain region;
   the source region, the first and the second spacer regions and the drain region having a doping of a first type;
   the first spacer region being disposed between the source region and the channel region, and the second spacer region being disposed between the channel region and the drain region;
   the first and second spacers having dielectric spacers extending outward from the portion of the fin in the first and second spacer regions and abutting the gate structure in planes perpendicular to an axis of the fin which planes define a gate structure dimension in the direction of charge carrier flow;
   the channel region comprising a sheath of lightly doped semiconductor, grown using low temperature epitaxial growth, over a thinned portion of the fin in the channel region so that the channel region has the same height and width as the adjoining first and second spacer regions of the fin, to define interfaces between the sheath in the channel region and respective portions of the first and second spacer regions of the fin;
   the thinning of the fin between the first and second spacer regions and the formation of the sheath over the thinned portion of the fin using low temperature epitaxial growth being done after the formation of the source, the first and second spacer, and the drain of the FinFET transistor;
   the sheath and the thinned portion of the fin both having crystalline structure as the sheath is epitaxially grown on the thinned portion of the fin, and the thinned portion of the fin, and the sheath having doping of a second type;
   the sheath having a lower level of doping than the thinned portion of the fin;
   the channel region being disposed under a gate structure comprising: a gate dielectric structure covering the sheath and a conductive gate covering the gate dielectric structure; and
   wherein the doping of interfaces between the sheath and respective portions of the first and second spacer regions abutting the sheath are abrupt in the direction of charge carrier flow as there is no inter-diffusion of dopants from or to the sheath to or from the respective abutting first and second spacer regions as the sheath is epitaxially grown at a low temperature;
   wherein the interfaces between the sheath and the respective portions of the first and second spacer regions are coplanar with the respective plane in which the respective spacer region abuts the gate structure; and
   wherein the use of low temperature processing and low temperature epitaxial depositions instead of implants and thermal diffusions, during and after the sheath formation, eliminate the FinFET transistor's threshold variance due to channel length variations and random doping variations near and in the channel region of the FinFET transistor.

2. The FinFET transistor of claim 1, wherein the thinned portion of the fin of the channel region is doped with donors for PMOS transistors or acceptors for NMOS transistors to a density between $10^{17}$ ions/cm$^3$ and $10^{20}$ ions/cm$^3$ and the sheath epitaxially grown on the thinned portion of the fin is lightly doped with donors for PMOS transistors or acceptors for NMOS transistors to a density less than $10^{17}$ions/cm$^3$.

3. The FinFET transistor of claim 1, wherein the sheath in the channel region has a thickness in the range of 5 nm to 15 nm.

4. The FinFET transistor of claim 1, wherein the channel region of the fin has a cross section perpendicular to the axis of the fin that is rectangular.

5. The FinFET transistor of claim 1, wherein the channel region of the fin has a cross section perpendicular to the axis of the fin that is triangular.

6. The FinFET transistor of claim 1, wherein the conducting gate comprise a material selected from at least one of: a metal, a metal alloy, or a metallic compound.

7. The FinFET transistor of claim 1, wherein the fin is formed on a conductive semiconductor substrate and is conductively connected to the semiconductor substrate.

8. The FinFET transistor of claim 7, wherein having the fin conductively connected to the semiconductor substrate enables biasing of the fin by application of a voltage to the connected substrate.

9. The FinFET transistor of claim 1, wherein the fin is formed on a dielectric on a substrate, and the fin extends in a direction perpendicular to the plane of the substrate to the dielectric which isolates the fin from the substrate.

10. The FinFET transistor of claim 1, wherein a continuity of the crystalline structure between the sheath in the channel region and the thinned portion of the fin in the channel region is assured by selective epitaxial growth of the sheath on the thinned portion of the fin in the channel region using a material chosen from the group comprising: silicon, germanium, an alloy of silicon and germanium.

11. The FinFET transistor of claim 1, wherein the sheath in the channel region is epitaxially grown and all processing of the FinFET transistor including and following the growth of the epitaxial sheath and any processing of an integrated circuit in which the FinFET transistor is used is done at temperatures of 650° C. or lower.

12. A FinFET transistor that reduces an effect of random doping fluctuations on a transistor's threshold voltage, the FinFET transistor formed of one or more fins, each fin comprising, in a direction of charge carrier flow, a source region, a first spacer region, a channel region, a second spacer region and a drain region,
   the source region, the first and second spacer regions and the drain region having a doping of a first type;
   the first spacer region being disposed between the source region and the channel region, and the second spacer region being disposed between the channel region and the drain region;
   the first and second spacers having dielectric spacers extending outward from the portion of the fin in the first and second spacer regions and abutting the gate structure in planes perpendicular to an axis of the fin which planes define a gate structure dimension in the direction of charge carrier flow;
   the channel region comprising a sheath of lightly doped semiconductor over a thinned portion of the fin in the channel region, the thinned portion of the fin and the sheath and the gate structure are formed between the first and second spacer regions after the formation of the source, drain, the first spacer region and the second spacer region such that the channel region interfaces between the sheath over a thinned portion of the fin and respective portions of the first and second spacer regions of the fin;

the sheath and the thinned portion of the fin having a continuous crystal crystalline structure as the sheath is grown using the low temperature epitaxial growth, on the thinned portion of the fin, and the thinned portion of the fin, and the sheath having doping of a second type;

the sheath having a lower level of doping than the thinned portion of the fin;

the channel region being disposed under a gate structure comprising: a gate dielectric structure covering the sheath and a conductive gate covering the gate dielectric structure; and wherein the doping density changes at the abutting interfaces between the sheath and respective portions of the first and second spacer regions are all abrupt in the direction of charge carrier flow and coplanar with the respective plane in which the respective adjoining first and second spacer regions abut the gate structure; and wherein the use of low temperature processing and low temperature epitaxial depositions instead of implants and thermal diffusions, during and after the sheath formation, eliminate the FinFET transistor's threshold variance due to channel length variations and random doping variations near and in the channel region of the FinFET transistor.

13. The FinFET transistor of claim 12, wherein the of the channel thinned portion of the fin is doped with donors for PMOS transistors or acceptors for NMOS transistors to a density between $10^{17}$ ions/cm$^3$ and $10^{20}$ ions/cm$^3$ and the sheath epitaxially grown on the thinned portion of the fin is lightly doped with donors for PMOS transistors or acceptors for NMOS transistors to a density less than $10^{17}$ ions/cm$^3$.

14. The FinFET transistor of claim 12, wherein the sheath in the channel region has a thickness in the range of 5 nm to 15 nm.

15. The FinFET transistor of claim 12, wherein the conducting gate comprise a material selected from at least one of: a metal, a metal alloy, or a metallic compound.

16. The FinFET transistor of claim 12, wherein the fin is fowled on a conductive semiconductor substrate and is conductively connected to the semiconductor substrate.

17. The FinFET transistor of claim 16, wherein having the fin conductively connected to the semiconductor substrate enables biasing of the fin by application of a voltage to the conductive conductor substrate.

18. The FinFET transistor of claim 12, wherein the fin is formed on a dielectric on a substrate, and the fin extends in a direction perpendicular to the plane of the substrate to the dielectric which isolates the fin from the substrate.

19. The FinFET transistor of claim 12, wherein a continuity of the crystalline structure between the sheath in the channel region and the thinned portion of the fin in the channel region is assured by selective epitaxial growth of the sheath on the thinned portion of the fin in the channel region using a material chosen from the group comprising: silicon, germanium, an alloy of silicon and germanium.

20. The FinFET transistor of claim 12, wherein the thinned portion of the fin is in contact with a conductive substrate and a threshold voltage of the FinFET transistor is enabled to be controlled by application of a voltage to the thinned portion of the fin and the sheath through the conductive semiconductor substrate in contact with the thinned portion of the fin.

21. The FinFET transistor of claim 12, wherein the sheath in the channel region is epitaxially grown and all further processing of the FinFET transistor including and following the growth of the epitaxial sheath is done at temperatures of 650° C. or lower.

* * * * *